United States Patent [19]
Oshiba

[11] Patent Number: 5,396,109
[45] Date of Patent: Mar. 7, 1995

[54] BIT CLOCK REGENERATING CIRCUIT AND DATA REGENERATING METHOD

[75] Inventor: Mitsuo Oshiba, Hachioji, Japan

[73] Assignee: Olympus Optical Co., Ltd., Tokyo, Japan

[21] Appl. No.: 950,139

[22] Filed: Sep. 24, 1992

[30] Foreign Application Priority Data

Sep. 26, 1991 [JP] Japan ................ 3-247771
Sep. 26, 1991 [JP] Japan ................ 3-247772
Feb. 4, 1992 [JP] Japan ................ 4-019186

[51] Int. Cl.$^6$ ............................................. H03L 7/06
[52] U.S. Cl. .................................. 327/233; 377/26; 327/100; 327/165
[58] Field of Search ........... 307/262, 528, 518, 279, 307/526, 527, 268; 328/164, 63, 115, 133, 206; 377/44, 37, 49, 55, 26

[56] References Cited
U.S. PATENT DOCUMENTS

| | | | |
|---|---|---|---|
| 4,385,395 | 5/1983 | Tanaka et al. | 307/528 |
| 4,389,643 | 6/1983 | Hill | 307/528 |
| 4,535,306 | 8/1985 | Yamaguchi et al. | 331/23 |
| 4,594,547 | 6/1986 | Halder | 307/262 |
| 4,656,528 | 4/1987 | Shichijo et al. | 358/342 |
| 5,005,141 | 4/1991 | Sanada et al. | 307/262 |

*Primary Examiner*—Timothy P. Callahan
*Assistant Examiner*—Dinh Le
*Attorney, Agent, or Firm*—Armstrong, Westerman, Hattori, McLeland & Naughton

[57] ABSTRACT

A bit clock regenerating circuit comprising an edge detector made up of two flip-flops for detecting edges of a binary signal and a gating circuit, a counter receiving an edge detected pulse from the edge detector as a load signal for setting an initial value, counting clock pulses with a given frequency, and generating a bit clock according to the result of the counting, and a ROM in which multiple conversion tables are formed to supply an initial value for the counter according to an output value of the counter, and a conversion table for determining regeneration conditions is selected according to a switching signal.

4 Claims, 9 Drawing Sheets

FREQUENCY OF INPUT DATA

FIG. 6(a)

| INPUT A0 TO A3 | OUTPUT D0 TO D3 |
|---|---|
| 0 | 1 |
| 1 | 2 |
| 2 | 3 |
| 3 | 3 |
| 4 | 3 |
| 5 | 3 |
| 6 | 3 |
| 7 | 3 |
| 8 | 15 |
| 9 | 15 |
| 10 | 15 |
| 11 | 15 |
| 12 | 15 |
| 13 | 15 |
| 14 | 15 |
| 15 | 0 |

FIG. 6(b)

| INPUT A0 TO A3 | OUTPUT D0 TO D3 |
|---|---|
| 0 | 1 |
| 1 | 2 |
| 2 | 3 |
| 3 | 3 |
| 4 | 3 |
| 5 | 3 |
| 6 | 3 |
| 7 | 3 |
| 8 | 11 |
| 9 | 12 |
| 10 | 13 |
| 11 | 14 |
| 12 | 15 |
| 13 | 15 |
| 14 | 15 |
| 15 | 0 |

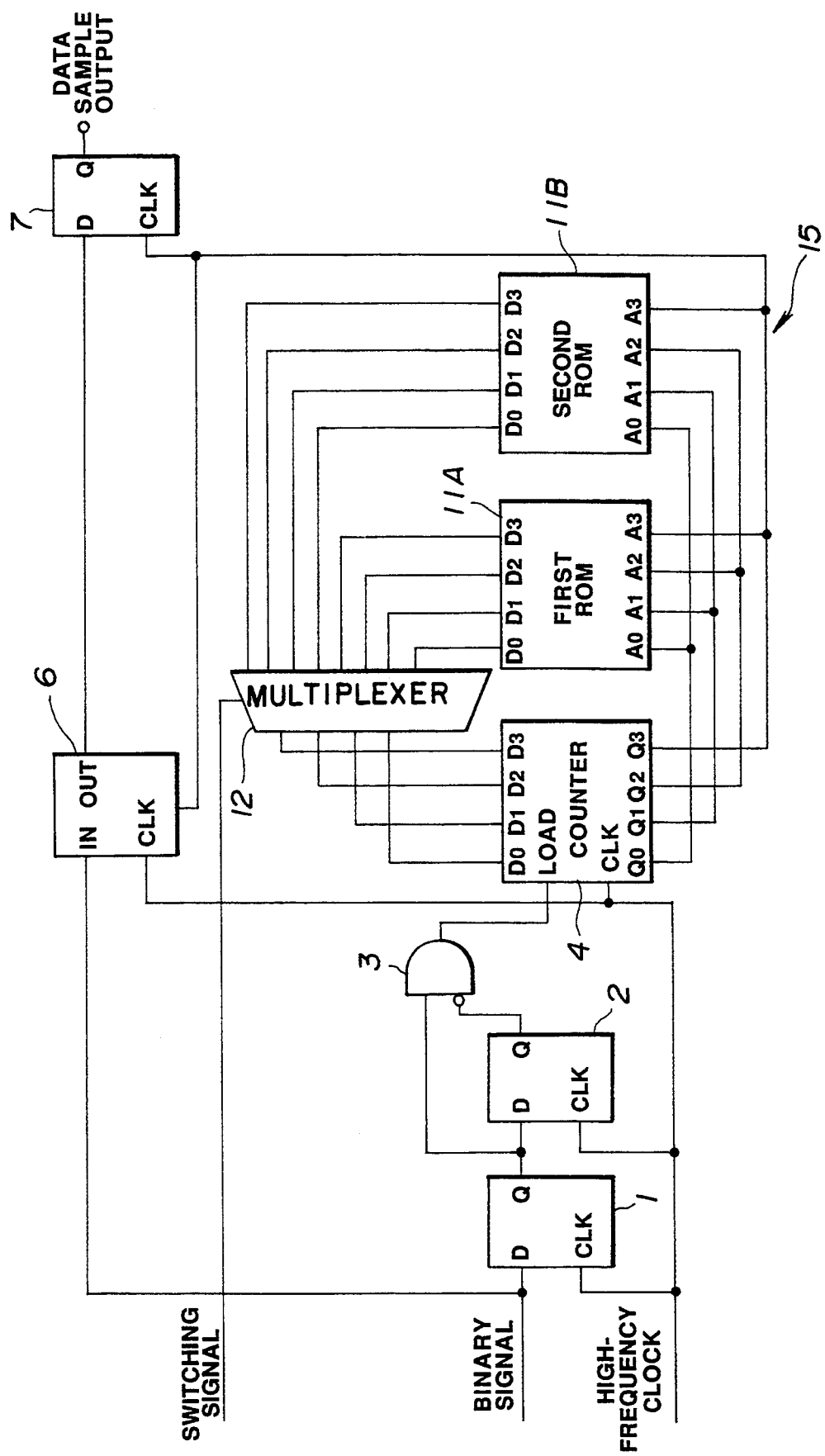

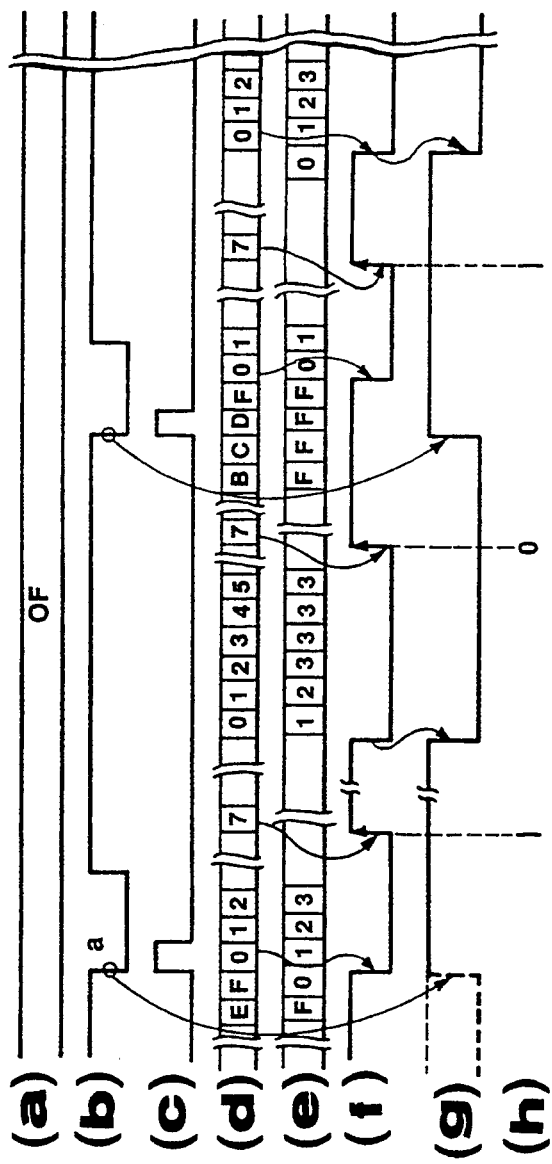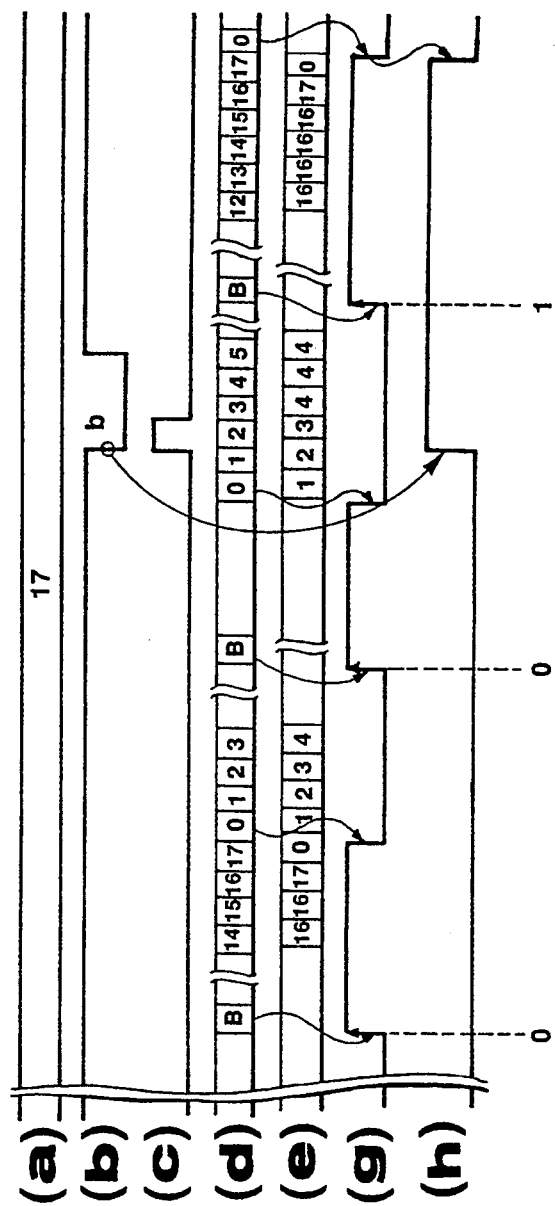
FIG.11

FIG. 12(a)

AVERAGE FREQUENCY 0F(H)

| INPUT ADDRESS AL (5 LOW-ORDER BITS) | OUTPUT DATA (5 BITS) |
|---|---|
| 0 | 1 |
| 1 | 2 |
| 2 | 3 |
| 3 | 3 |
| 4 | 3 |
| 5 | 3 |
| 6 | 3 |
| 7 | 3 |
| 8 | F |
| 9 | F |
| A | F |
| B | F |
| C | F |
| D | F |
| E | F |
| F | 0 |
| 10 | 0 |
| 11 | 0 |
| 12 | 0 |
| 13 | 0 |
| 14 | 0 |
| 15 | 0 |
| 16 | 0 |
| 17 | 0 |

FIG. 12(b)

AVERAGE FREQUENCY 17(H)

| INPUT ADDRESS AL (5 LOW-ORDER BITS) | OUTPUT DATA (5 BITS) |
|---|---|
| 0 | 1 |
| 1 | 2 |
| 2 | 3 |
| 3 | 4 |
| 4 | 4 |
| 5 | 4 |
| 6 | 4 |
| 7 | 4 |
| 8 | 4 |
| 9 | 4 |
| A | 4 |
| B | 4 |
| C | 16 |
| D | 16 |
| E | 16 |
| F | 16 |
| 10 | 16 |
| 11 | 16 |
| 12 | 16 |
| 13 | 16 |
| 14 | 16 |
| 15 | 16 |
| 16 | 17 |
| 17 | 0 |

BIT CLOCK REGENERATING CIRCUIT AND DATA REGENERATING METHOD

BACKGROUND OF THE INVENTION

Field of the Invention

The present invention relates to a bit clock regenerating circuit for generating a bit clock for retry or regeneration, and to a data regenerating method.

Description of the Related Art

Assuming that MFM, (2, 7) modulation, or other self-clock modulation technique is employed to record digital data, when the digital data is regenerated, a bit clock must be regenerated at every change point of the data stream and the data must be sampled according to the bit clock. A data stream change point is a transition point from a logic 0 to 1 or a logic 1 to 0 for mark length recording, or from a logic 0 to 1 for inter-mark recording.

A bit clock regenerating circuit designed for the above purpose is divided into two types such as analog PLL and digital PLL.

FIG. 1 shows an analog PLL circuit. In this configuration, a voltage controlled oscillator 53 produces a bit clock. A phase comparator 51 compares the phase of data at a change point with the phase of the bit clock. The compared output voltage is passed through a low-pass filter 52, then fed to the voltage controlled oscillator 53. Thus, the bit clock is corrected in phase.

FIG. 2 shows a digital PLL circuit. In this configuration, a high-frequency master clock is fed to a clock terminal CK of a counter 55 and divided in frequency. Then, a bit clock is produced. Detected pulses of data edges are fed to a load terminal LD of the counter 55. Thereby, the counter 55 is loaded with a certain value at every data edge. Thus, the bit clock is corrected in phase.

In the analog PLL circuit, the self-excited frequency of the voltage controlled oscillator 53 is susceptible to temperature, humidity, and a time-sequential change. Therefore, the PLL tends to lose its lock. When the speed of operation varies greatly, the center frequency of the voltage controlled oscillator must be adjusted to match the speed precisely. This is, however, impossible in practice. The analog PLL circuit has the advantage that the phase of a bit clock is responsive to an average phase of phases at data edges.

In general, the digital PLL circuit is too sensitive to a very small jitter occurring at a data change point due to a peek shift. This is because phase correction is applied instantaneously. Therefore, a jitter is included in a bit clock, or a bit clock with an extremely short or long cycle is generated.

Japanese Examined Patent Publication No.3-30338 has disclosed a circuit in which, as shown in FIG. 3, a load-type counter 57 and a ROM 58 are used to overcome the foregoing drawbacks. The circuit, unlike a conventional circuit, does not load the counter 57 with a certain constant at every data change point, but reads a number determined with an output state of the counter at that time from the ROM 58 and loads the counter with the number. Therefore, for this circuit, the response characteristic of a bit clock to a jitter at a data change point can be determined freely. The response characteristic can be established in such a manner that a backlash will be produced to prevent a jitter of a bit clock due to a very small jitter occurring at a data change point because of a peak shift or that a flywheel effect will be implemented to provide a response characteristic similar to that of an analog PLL circuit.

When a data regenerating apparatus using an optical disk, magnetic disk, optical card, or other recording medium regenerates data, if the apparatus fails to read data, a retry is executed in general. However, repeating a retry using the same regenerating method means expecting accidental reading, which is, therefore, not very effective.

In this case, conditions for data regeneration should, apparently, be varied to execute a retry effectively. In the foregoing data regenerating apparatus using a recording medium, causes of reading failures are, for example, dust, dirt, or defects of the recording medium. Due to these causes, regenerative signals distort, a bit clock gets unlocked, errors increase in number, and eventually error correction becomes impossible. However, conventional circuits are deficient in treating these events effectively during a retry of data regeneration.

In the bit clock regenerating circuit shown in FIG. 3, input data is processed to generate a bit clock on the assumption that an average frequency of the input data is constant as shown in FIG. 4a. The frequency is represented as {(high-frequency clock frequency/2n} (where, n denotes the number of bits with which the counter 57 counts up. In FIG. 3, n equals to 4.). In other words, no measure has been taken to cope with a variation in average frequency of input data, as shown in FIG. 4b.

In general, an information regenerating apparatus using a disk-type optical recording medium such as an optical disk and a magnetic disk records and regenerates information with rotation of the recording medium. Therefore, a frequency of input data can be held relatively stable and precise.

However, in an information regenerating apparatus using a recording medium such as an optical card, the optical recording medium is reciprocated to record and regenerate information. Therefore, in this apparatus unlike an apparatus using a disk-type optical recording medium, a speed of feeding a medium is unstable, and a frequency of input data may vary. Therefore, the aforesaid conventional bit clock regenerating circuit cannot be used for this apparatus as it is.

SUMMARY OF THE INVENTION

An object of the present invention is to provide a bit clock regenerating circuit using a digital PLL, effectively regenerating data for retry, and permitting a simple configuration.

Another object of the present invention is to provide a data regenerating method employing a bit clock regenerating circuit that uses a digital PLL and permits a simple configuration, and effectively regenerating data for retry.

Still another object of the present invention is to provide a bit clock regenerating circuit using the foregoing digital PPL and capable of regenerating a stable bit clock even when input data contains a frequency variation.

The present invention is a bit clock regenerating circuit for generating a bit clock, comprising an edge detecting means for detecting edges of a binary signal, a counting means having its initial value set using a load signal or each edge detected pulse the edge detecting means outputs and counting clock pulses having a given frequency, and conversion tables each supplying an initial value for the counting means according to the output value of the counting means. The bit clock regenerating circuit further comprises a conversion table selecting means for selecting a single conversion table from among multiple conversion tables.

The present invention is a data regenerating method using the foregoing bit clock regenerating circuit. For normal operation, one conversion table is selected from among multiple conversion tables to regenerate data, and for retry, other conversion table is selected from among the multiple conversion tables to regenerate the data.

The other features and advantages of the present invention will be apparent from the detailed description below.

BRIEF DESCRIPTION OF THE DRAWINGS

FIG. 6(a) and 6(b) are an explanatory diagram showing data contained in a ROM;

FIG. 7 is a configuration diagram of a bit clock regenerating circuit according to the second embodiment;

FIG. 11 shows an example of a timing chart for the circuit shown in FIG. 9; and

FIG. 12(a) and 12(b) show examples of conversion tables.

DETAILED DESCRIPTION OF THE PREFERRED EMBODIMENTS

Embodiments of the present invention will be described with reference to the drawings.

Figure 5:
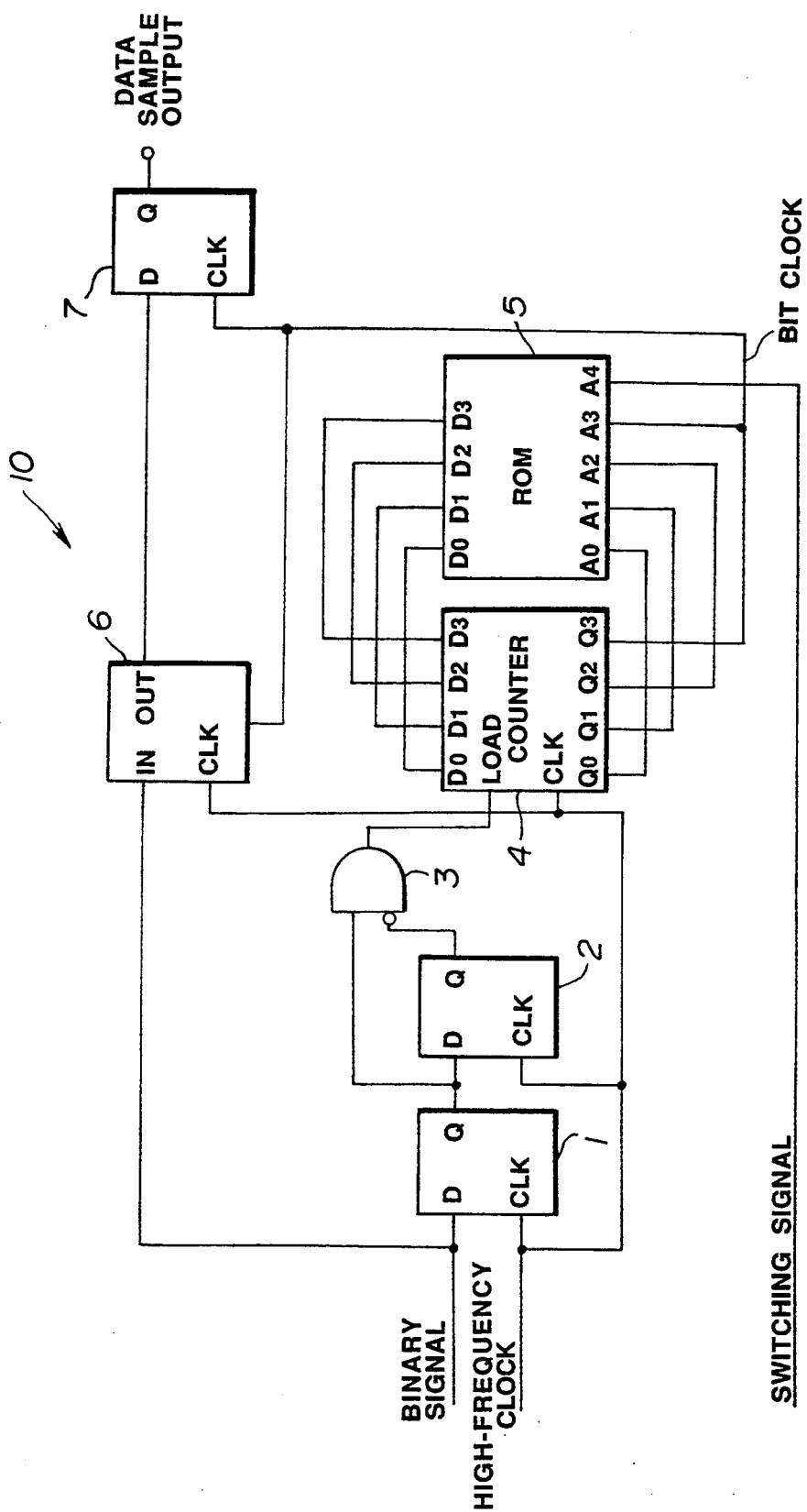
FIG. 5 is a configuration diagram of a bit clock regenerating circuit according to the first embodiment.

FIGS. 5 and 6 relate to the first embodiment of the present invention. FIG. 5 shows a bit clock regenerating circuit of the first embodiment. FIG. 6 shows data contained in a ROM. The bit clock regenerating circuit is based on a data regenerating method of the first embodiment.

The description below shall be proceeded on the assumption that an inter-mark recording method is employed. That is to say, a change point of a data stream is a transition point from a logic 0 to 1.

An optical head or other information regenerating head designed for regenerating data, which is not shown, regenerates and outputs recorded information (data) from a recording medium which is not shown. A binary signal is produced by trimming the waveform of the regeneration data.

The binary signal is applied to a data input terminal of a first D flip-flop 1 constituting a bit clock regenerating circuit 10 of the first embodiment. The output of the first D flip-flop 1 is applied to a data input terminal of a second D flip-flop 2. The signal applied to the data input terminals of these two D flip-flops 1 and 2 is latched at the leading edge of a high-frequency clock having a fixed frequency to be applied to the clock input terminals, then sent from the output terminals.

The outputs of the D flip-flops 1 and 2 are fed to a gating circuit 3. Then, detected pulses indicating detected edges of the binary signal are generated, then applied as a load signal to a load terminal of a counter 4. A clock input terminal of the counter 4 is provided with the high-frequency clock. In this embodiment, the gating circuit 3 is made up of an AND gate and an inverter.

Output terminals of the counter 4 are connected to address (input) terminals of a read only memory (hereafter, ROM) 5 forming, for example, two conversion tables for changing regeneration conditions. Data output terminals of the ROM 5 are connected to preset terminals (load input terminals) of the counter 4. Data is read from the ROM 5 according to a count output of the counter 4. The read data is supplied to a preset terminal of the counter 4, then established as an initial value with a load signal.

The binary signal enters a demodulation signal generating circuit 6. The high-frequency clock is applied to a clock input terminal of the demodulation signal generating circuit 6. The demodulation signal generating circuit 6 generates a signal which represents a 1 at the leading edge of the binary signal and a 0 at the trailing edge of a bit clock signal. The output of the demodulation signal generating circuit 6 is applied to a data input terminal of a third D flip-flop 7. The most significant bit (hereafter, MSB) output of the counter 4 is applied as a clock to a clock input terminal of the third D flip-flop 7. At the leading edge of the clock, the third D flip-flop 7 samples data applied to its data input terminal and outputs it as a data sample output.

A switching signal is applied to an MSB address terminal of the ROM 5. With the switching signal, information stored in the ROM 5 are switched. In this embodiment, the high-frequency clock has a frequency 16 times higher than an intended bit clock. Therefore, a 4-bit hexadecimal counter is used as the counter 4.

In the ROM 5, data indicating response characteristics of a bit clock relative to a jitter of a binary signal are recorded as tables. The ROM 5 contains two tables shown in FIGS. 6a and 6b. However, the two tables are nothing but examples. The number of tables may be three. Furthermore, the contents of the two tables can be modified effortlessly.

According to the table of FIG. 6a, when a phase shift of a binary signal exceeds ±3 cycles of a bit clock, the phase of the bit clock is shifted by a difference of the phase shift minus 2 in a direction identical to that of the phase shift of the binary signal. In short, this table provides a prescribed backlash of ±2 clock cycles. Employment of this table can prevent the bit clock from tracking a jitter of a binary signal too sensitively.

On the other hand, according to the table shown in FIG. 6b, when a phase shift of a binary signal counts ±2 cycles or less of a bit clock, the bit clock is not corrected in phase to track the phase shift. When the phase shift exceeds ±2 clock cycles, the bit clock is corrected in phase to track the phase shift. According to the table, when a forward phase shift of the binary signal exceeds four clock cycles, the bit clock is not corrected in phase to track the phase shift. Employment of the table prevents the bit clock from causing a Jitter and restricts a forward cycle variation.

The ROM 5 contains conversion table data, whereby methods of controlling a phase shift of a regeneration bit clock relative to a phase shift of a binary signal can be changed.

In this embodiment, a ROM 5 shown in FIG. 5 runs in 5-bit addressing. Outputs $Q_0$ to $Q_3$ of a counter 4 are fed to address terminals $A_0$ to $A_3$ of the ROM 5. A switching signal sent from a controller (not shown) for controlling a bit clock regenerating circuit 10 is fed to an address terminal $A_4$. The ROM 5, therefore, contains a total of 32 words each consisting of four bits. The two sets of data are switched with a switching signal. More specifically, during normal data reading, the switching signal is set to, for example, a 0, so that a conversion table composed of low-order 16 words will be read from the ROM 5. Under these conditions for regeneration, if data regeneration fails and a retry is carried out, the switching signal is switched to a 1. Thus, the regeneration conditions are switched so that conversion table data composed of 16 high-order words will be read.

The operation of a bit clock regenerating circuit 10 having the aforesaid configuration and that of a data regenerating method using the circuit will be described below.

First, a controller which is not shown outputs a switching signal of a 0 during normal data reading. In this case, data (initial value) consisting of 16 low-order words is read from a ROM 5 according to outputs $Q_0$ to $Q_3$ of a counter 4. The counter 4 is held in a state for loading the data at every leading edge of a binary signal.

D flip-flops 1 and 2, and a gating circuit 3 generate a pulse having a duration comparable to one cycle of a high-frequency clock at every leading edge of the binary signal. The counter 4 is of a load type. The pulse passing through the gating circuit 3 is fed as a load pulse to a load terminal of the counter 4. The counter 4 is loaded with data entering load input terminals $D_O$ to $D_3$ at the negative edge of the load pulse. Then, the outputs are sent via output terminals $Q_0$ to $Q_3$. To be more specific, the counter 4 counts up from the initial value in response to high-frequency clock pulses produced after the load pulse. Then, the MSB output $Q_3$ of the counter 4 is supplied as a bit clock signal to a third D flip-flop 7.

The binary signal and high-frequency clock are supplied to a demodulation signal generating circuit 6. The demodulation signal generating circuit 6 generates a demodulation signal which represents a 1 at the leading edge of the binary signal and a 0 at the trailing edge of the bit clock signal. The generated demodulation signal is fed to the third D flip-flop 7, then sampled according to the timing of the bit clock signal. Then, the third D flip-flop 7 outputs the sampled signal as a data sample output. The data sample output is fed to an error correcting circuit of a data demodulating circuit which is not shown, then subjected to error correction. If the error correction fails to correct errors, the information (for example, error correction disabled) is transferred to a controller which is not shown.

In this case, the controller switches the switching signal to a 1, then places the switching signal in the ROM 5. Thereby, data to be loaded from the ROM 5 into the counter 4 are switched. The bit clock regenerating circuit 10 enters a regeneration state different from a normal regeneration state (conditions). In this state, the circuit 10 executes data regeneration.

In this embodiment, conditions for retry regeneration are set differently from those for normal regeneration. Therefore, data regeneration can be performed more effectively than that when regeneration conditions are not switched. Furthermore, the embodiment provides this advantage despite a simple circuitry. For example, according to a prior art disclosed in Japanese Examined Patent Publication No.3-30338, one ROM running in 4-bit addressing is employed, and even when regeneration fails, regeneration conditions cannot be changed. On the contrary, this embodiment can change conditions and eventually improves the regeneration function.

As described previously, the bit clock regenerating circuit of this embodiment is configured so that any of multiple conversion tables can be selected. Therefore, despite a simple configuration, the regenerating circuit can change conditions for regenerating a bit clock during a retry of data reading. Consequently, the data regeneration function improves.

According to the data regenerating method of the first embodiment, a bit clock regenerating circuit employed has a configuration enabling selection of any of multiple conversion tables for determining data regeneration conditions, and conversion table data specifying conditions different from those for normal data regeneration is selected for retry, then data regeneration is carried out. Therefore, the data regeneration function for retry improves.

FIG. 7 shows a bit clock regenerating circuit 15 according to the second embodiment of the present invention. A data regenerating method of the second embodiment employs the circuit. The bit clock regenerating circuit 15 of the second embodiment is identical to the circuit 10 of the first embodiment except that the ROM 5 is replaced by a first ROM 11A and a second ROM 11B. Output terminals of these ROMs 11A and 11B are connected to preset terminals of a counter 4 via a multiplexer 12. The multiplexer 12 switches outputs $D_O$ to $D_3$ of the ROM 11A or 11b into the outputs of the other ROM 11B or 11A, then applies the switched outputs to the counter 4.

Each of the ROMs 11A and 11B in this embodiment runs in 4-bit addressing and has a capacity for storing information of 16 words. The ROMs 11A and 11B contain conversion tables in which data shown in FIGS. 6a and 6b are written respectively. The other components are identical to those shown in FIG. 5, and assigned the same numerals. The description will, therefore, be omitted.

In this embodiment, methods (conditions for regeneration) for controlling a phase shift of a regeneration bit clock relative to a phase shift of a binary signal are changed. For changing regeneration conditions, the embodiment has two ROMs 11A and 11B, and a multiplexer 12 for selectively providing the outputs of the ROMs to a counter 4. A switching signal sent from a controller (not shown) for controlling a bit clock regenerating circuit 15 is applied to a selection terminal of the multiplexer 12.

In this embodiment, for normal data reading, the switching signal is set to a 0, and the outputs of the ROM 11A are supplied to the counter 4. Therefore, the outputs $D_O$ to $D_3$ of the ROM 11A are loaded in the counter 4 according to the outputs $Q_0$ to $Q_3$ of the counter 4.

If data reading fails, when a retry is executed, the switching signal is set to a 1. Then, the outputs of the ROM 11B are supplied to the counter 4. Therefore, the outputs $D_O$ to $D_3$ of the ROM 11B are loaded in the counter 4 according to the outputs $Q_0$ to $Q_3$ of the counter 4.

The second embodiment has the aforesaid simple circuitry and still changes characteristics of bit clock regeneration.

Figure 8:
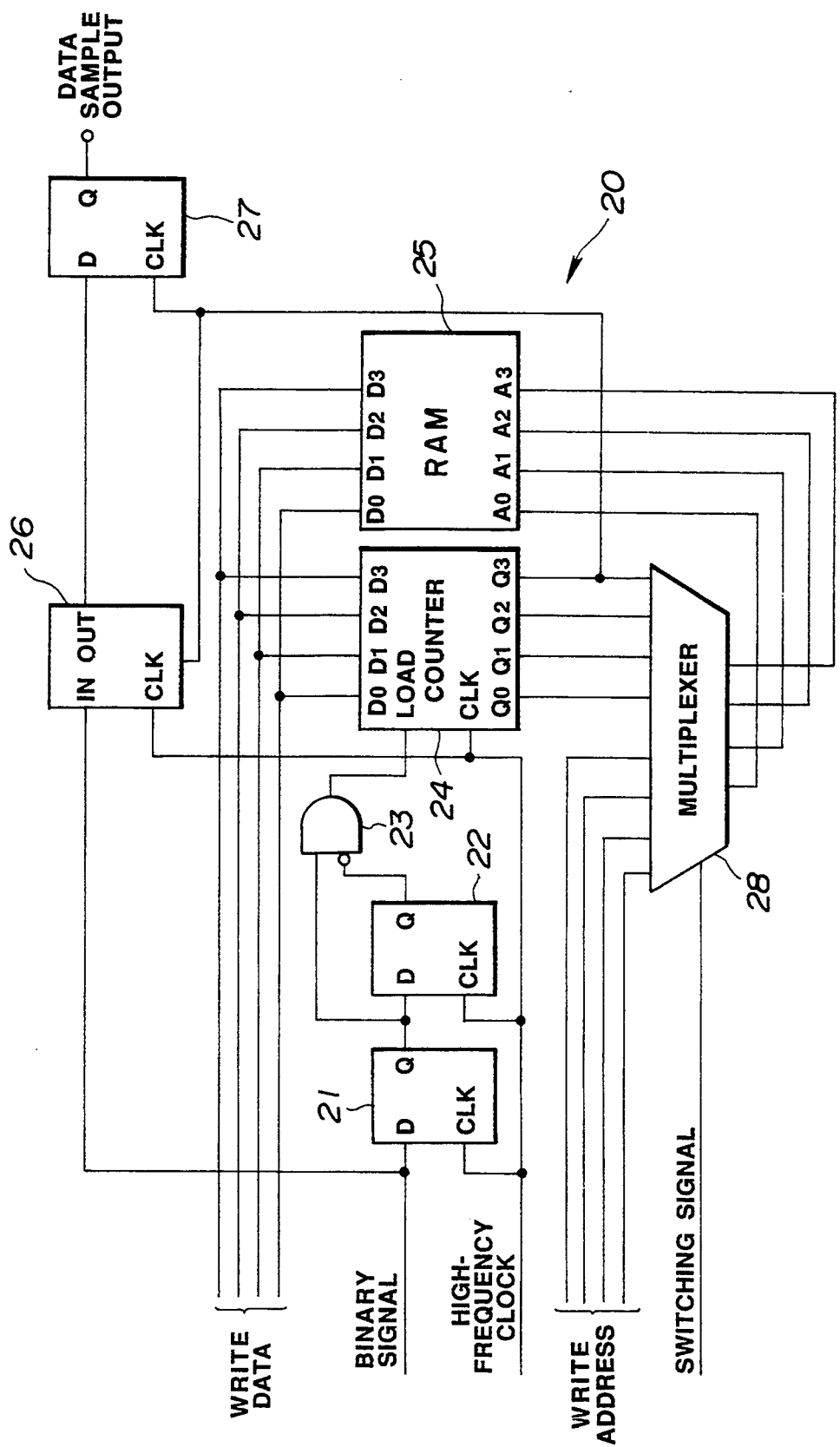
FIG. 8 is a configuration diagram of a bit clock regenerating circuit according to the third embodiment.

FIG. 8 shows a configuration of a bit clock regenerating circuit 20 employed for the third embodiment of the present invention. Numerals 21 and 22 denote D flip-flops. 23 denotes a gating circuit. 24 represents a counter. 25 denotes a random access memory (hereafter, RAM) running in 4-bit addressing. A numeral 26 represents a demodulation signal generating circuit, and 27, a D flip-flop. A numeral 38 denotes a multiplexer. The multiplexer 38 switches outputs according to a switching signal, so that an address sent from a controller (not shown) will be specified in the RAM 25 for writing data in the RAM 25, while an output of the counter 24 will be specified as an address in the RAM 25 for normal operation.

The D flip-flops 21 and 22, gating circuit 23, counter 24, demodulation signal generating circuit 26, and D flip-flop 27 have the same functions as those in the first embodiment. In this embodiment, the RAM 25 is used instead of the ROM 5. That is to say, response characteristics of a bit clock that are written in the ROM for storing fixed data in the first embodiment are stored in the RAM 25 so that they can be rewritten by the controller if necessary. Thereby, in this embodiment, it becomes possible to change methods of controlling a phase shift of a regeneration bit clock relative to a phase shift of a binary signal. To be more specific, for normal data reading, response characteristic data shown in FIG. 6a is written in the RAM 25 beforehand, then normal data reading is performed. If data reading fails, when a retry is executed, response characteristic data shown in FIG. 6b is written in the RAM 25, then retry data reading is carried out.

Thus, this embodiment can change bit clock regeneration characteristics using a simple circuit 20, and still has the same operation and advantages as the first embodiment.

In the first embodiment, a ROM 5 consists of two conversion tables where one conversion table is selected for retry. With this invention, the number of conversion tables is not restricted to two but may be three or more. Then, a conversion table different from that for normal regeneration may be selected for retry. For multiple retries, conversion tables may be changed at every retry or any conversion table may be specified.

Figure 1:
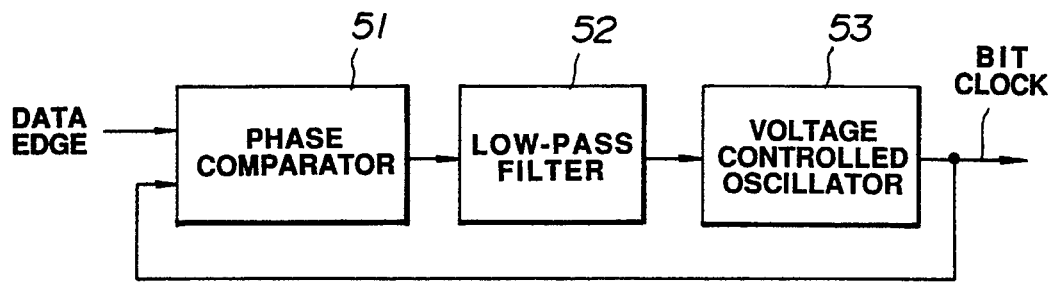
FIG. 1 is a block diagram of an analog PPL of a prior art.
Figure 2:
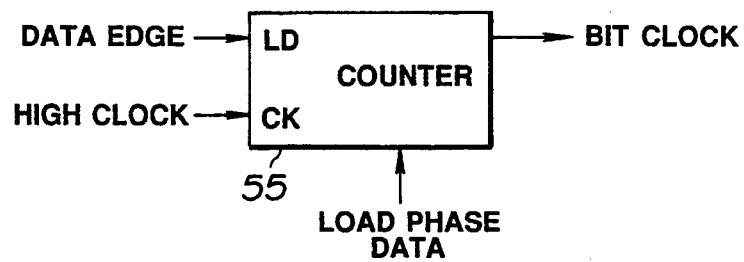
FIG. 2 is a block diagram of a digital PPL of a prior art.
Figure 3:
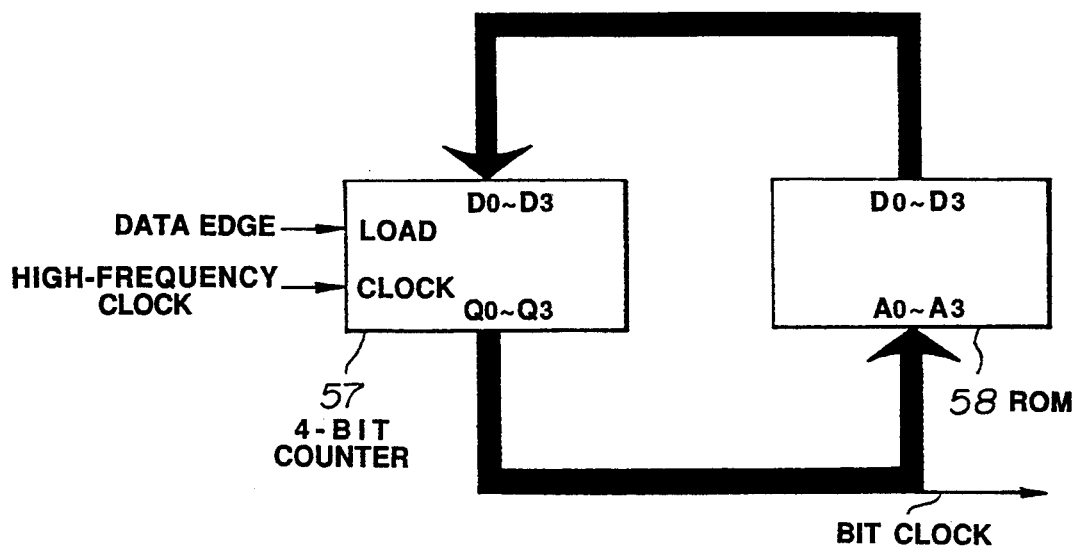
FIG. 3 shows a bit clock regenerating circuit of a digital type of a prior art.
Figure 4:
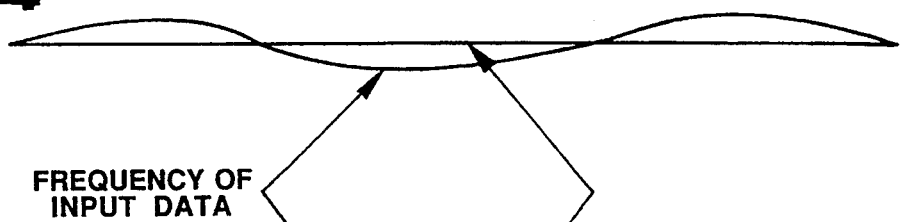
FIG. 4(a) and 4(b) are an explanatory diagram concerning a frequency variation in input data.
Figure 4:
Figure 10:
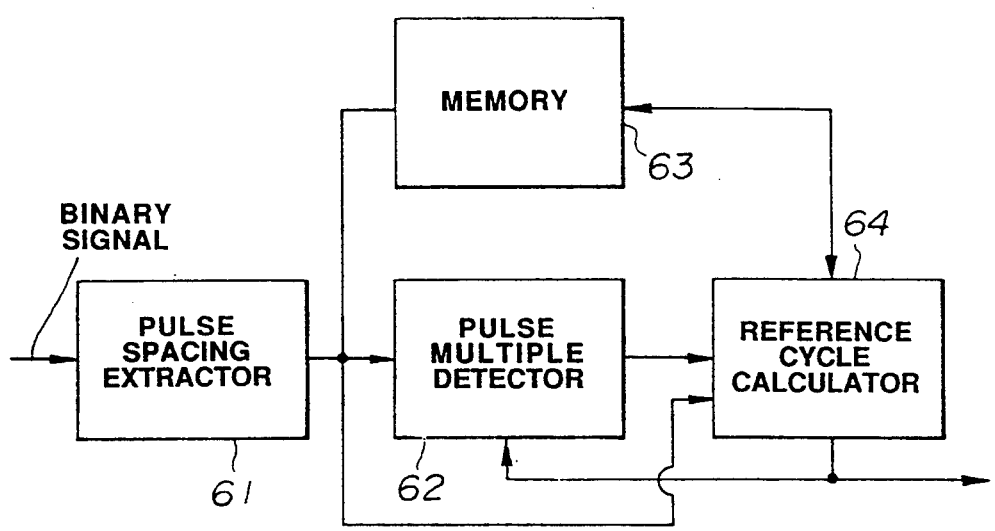
FIG. 10 is a block diagram of a reference cycle calculating circuit.
Figure 9:
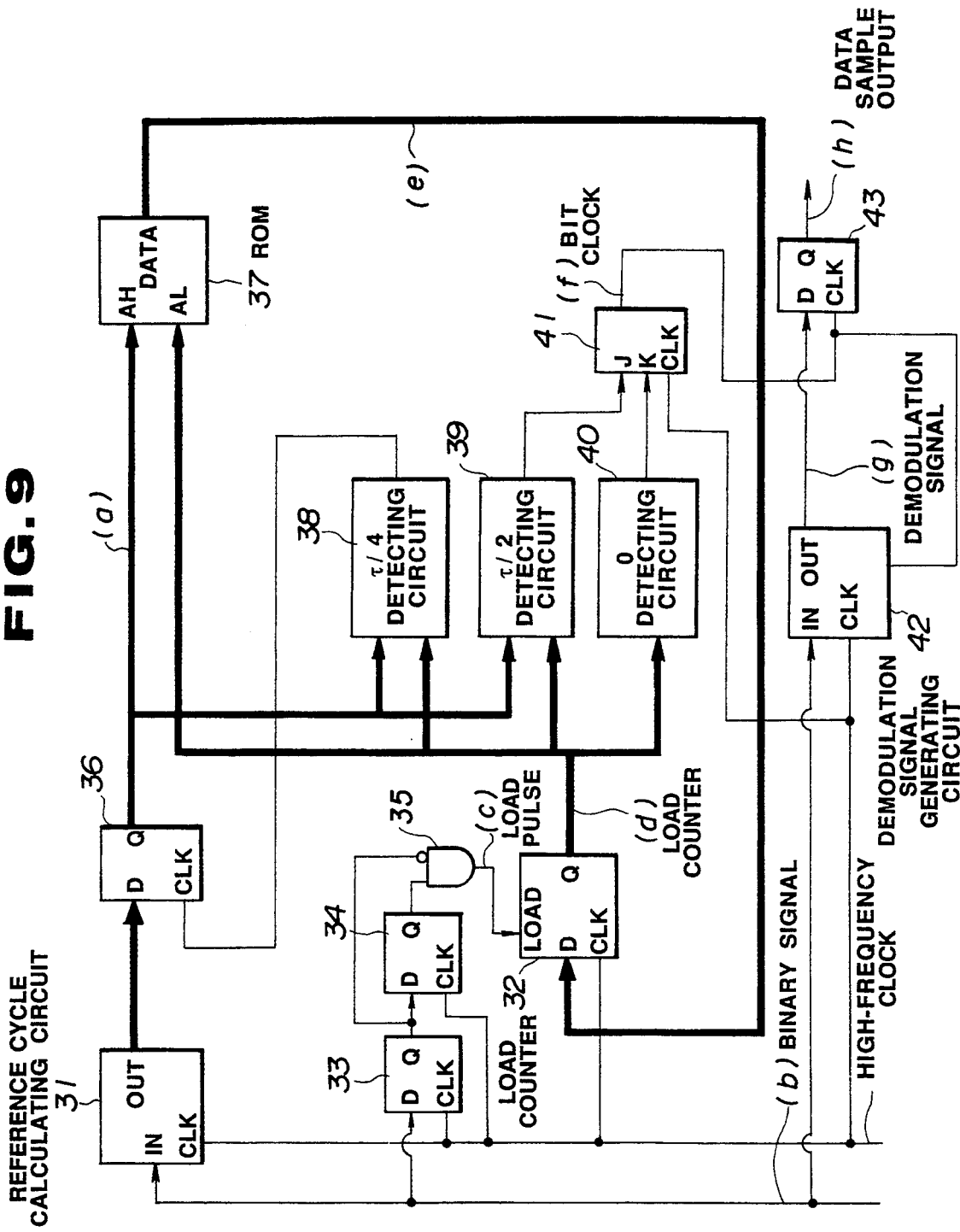
FIG. 9 is a configuration diagram of a bit clock regenerating circuit according to the fourth embodiment.

FIGS. 9 to 12 relate to the fourth embodiment of the present invention. FIG. 9 is a block diagram of a bit clock regenerating circuit. FIG. 10 is a block diagram of a reference cycle calculating circuit. FIG. 11 is an example of a timing chart for the circuit shown in FIG. 9. FIG. 12 is an explanatory diagram showing examples of conversion tables.

FIG. 9 shows an example of a bit clock regenerating circuit of the present invention. The description below shall be proceeded on the assumption that an inter-mark recording method is employed. That is to say, a change point of a data stream is a transition point from a logic 0 to 1.

The bit clock regenerating circuit shown in FIG. 9 comprises a reference cycle calculating circuit 31, a load counter 32, D flip-flops 33, 34, 36, and 43, a gating circuit 35, a $\tau/4$ detecting circuit 38, a $\tau/2$ detecting circuit 39, a 0 detecting circuit 40, a JK flip-flop 41, and a demodulation signal generating circuit 42. In this embodiment, the gating circuit 35 is made up of an AND gate and an inverter.

The reference cycle calculating circuit 31 inputs a binary signal and detects an average frequency (average $1\tau$) of the binary signal. The load counter 32 is a load-type counter, and loaded with an D input whose value is supplied as an Q output according to an input of an load terminal (LOAD). In other states, the load counter 32 counts high-frequency clock pulses entering a CLK terminal, and outputs a count (d).

The D flip-flops 33 and 34 and gating circuit 35 generate a detected signal (c) indicating detected trailing edges of a binary signal. The detected signal serves as a load signal for the load counter 32. The binary signal enters a D input terminal of the D flip-flop 33, and the high-frequency clock enters a CLK input terminal of the D flip-flop 33. A D input terminal of the D flip-flop 34 is provided with a Q output of the D flip-flop 33, and a CLK input terminal of the D flip-flop 34 is provided with the high-frequency clock. The Q output of the D flip-flop 33 is fed to one of the input terminals of the gating circuit 35 (one of two input terminals of the AND gate via the inverter), and the Q output of the D flip-flop 23 is fed to the other input terminal. With the output of the gating circuit 35, an edge detected signal or a load pulse (c) is supplied.

The D flip-flop 36 has multiple bit spots (for example, five bit spots), latches an output of the reference cycle calculating circuit 31 according to an output signal of the $\tau/4$ detecting circuit 38, then outputs an average cycle (a) to the ROM 37.

An initial value (e) of a count of the load counter 32 is read from the ROM 37 and supplied to the D input terminal of the load counter 32 via a data output terminal (Data). The ROM 37 contains data indicating response characteristics of a bit clock relative to a jitter of a binary signal. More specifically, the data are conversion tables each having an initial value for compensating for a phase lead or lag specified in association with an average cycle. In the ROM 37, an average cycle (a) is placed at the high-order address $A_H$. Then, a conversion table pointed to by the high-order address value is selected. The load count (d) is placed at the low-order address $A_L$. Then, the low-order address value is converted according to the selected conversion table. Finally, an initial value (e) is supplied.

The $\tau/4$ detecting circuit 38 detects a match between a count (d) the load counter 32 outputs and a value of a quarter of an average cycle (a). The output of the $\tau/4$ detecting circuit 38 determines, as described previously, the time of latching data (reference cycle) in the D flip-flop 36.

The $\tau/2$ detecting circuit 39 detects a match between a count (d) the load counter 32 outputs and a value of half of an average cycle (a). The 0 detecting circuit 40 detects a time when the count (d) the load counter 32 outputs is zero.

The JK flip-flop 41 receives an output of the $\tau/2$ detecting circuit 38 via its J input terminal, an output of the 0 detecting circuit 40 via its K input terminal, and the high-frequency clock via its CLK input terminal, then generates a bit clock (f). The demodulation signal generating circuit 52 generates a demodulation signal (g) which represents a 1 at the trailing edge of a binary signal and a 0 at the trailing edge of the bit clock (f). The D flip-flop 43 samples the output of the demodulation signal generating circuit 42 using the bit clock (f). The output of the D flip-flop 43 is a data sample output (h).

FIG. 10 is an example of a block diagram of the reference cycle calculating circuit.

A pulse spacing extractor 61 uses a counter to count pulse spacings of a pulse train of a binary signal, and supplies the count p to a pulse multiple detector 62, a memory 63, and a reference cycle calculator 64.

The pulse multiple detector 62 divides a counted pulse spacing p by a current cycle the reference cycle calculator to be described later outputs, computes a multiple n indicating how many times the pulse spacing p is larger than the cycle T, then outputs the multiple n to the memory 63 and reference cycle calculator 64.

On the other hand, the memory 63 sequentially stores pulse spacings p the pulse spacing extractor 61 provides, and contains multiple, say seven past pulse spacings ($p_{n-7}$, $p_{n-6}$, $p_{n-5}$, etc. $p_{n-1}$). The memory 63 sequentially stores multiples n the pulse multiple detector 62 provides, and contains multiple, say seven past multiples n ($n_{n-7}$, $n_{n-6}$, $n_{n-5}$, etc. $n_{n-1}$).

The reference cycle calculator 64 sums up a current pulse spacing $p_n$ and a current multiple $n_n$ the pulse spacing extractor 61 and the pulse multiple detector 62 provide respectively, and seven predetermined consecutive pulse spacings ($p_{n-7}$, $p_{n-6}$, $p_{n-5}$, etc. $p_{n-1}$) and multiples ($n_{n-7}$, $n_{n-6}$, $n_{n-5}$, etc. $n_{n-1}$) placed beforehand in the memory 63. To be more specific, a sum of eight pulse spacings or $p_t = (p_{n-7} + p_{n-6} + p_{n-5} + \text{etc.} + p_{n-1} + p_n)$ and a sum of eight multiples or $n_t = (n_{n-7} + n_{n-6} + n_{n-5} + \text{etc.} + n_{n-1} + n_n)$ are calculated. The reference cycle calculator 64 divides the sum $p_t$ of pulse spacings by the sum $n_t$ of multiples to calculate a new average cycle $\tau$, then outputs the calculated average cycle to the D flip-flop 36. The calculated average cycle is also supplied as a reference cycle for detecting the next pulse multiple to the pulse multiple detector 62. Thus, a new average cycle $\tau$ is calculated using the sum $p_t$ of multiple consecutive pulse spacings and the sum $n_t$ of their multiples. Thus, an average cycle $\tau$ for canceling out jitter components of individual pulses is worked out.

FIG. 12 shows examples of conversion tables indicating data of response characteristics of a bit clock that are existent in a ROM 37. FIG. 12a shows a conversion table for use when an average cycle a reference frequency calculating circuit 31 calculates is 0FH. According to the table, when an input address or a load count (d) of a load counter 32 is 0±2 (0EH, 0FH, 00H, 01H, or 02H), a sum of the value plus 1 is supplied. In other cases, a fixed value is output. The fixed value is 03H for a load count ranging from 03 to 07, and 0FH for a load count ranging from 08 to 0D. Specifically, according to the table, when a trailing edge of a binary signal deviates ±3 or more in clock cycle from a reference value (00H) specified in the load counter 32, the phase of the binary signal is locked in 03H or 0FH. When the deviation is within ±2, nothing is done. This means that the neutral zone has a width of ±2. Herein, since a single cycle of a binary signal counts 10 H, the neutral zone width becomes ±12.5% of the cycle.

FIG. 12b shows a conversion table for use when an average cycle a reference cycle calculating circuit 31 calculates is 17H. In this case, an input address a counter 32 provides can take on a value ranging from 00H to 17H. The neutral zone width is almost the same as that for the table of FIG. 12a.

FIG. 12 shows examples of conversion tables for use with average cycles 0FH and 17H respectively. In a ROM 37 shown in FIG. 9, tables are written in association with cycle (or frequency) variations of a binary signal. In other words, the number of the tables equals to the number of possible cycle variations. Switching tables is achieved by specifying an average cycle (a) as an address of the ROM 37.

A response characteristic of a bit clock relative to a jitter at a data change point can be determined freely by selecting a conversion table. The response characteristic is determined depending on by what percentage a neutral zone will occupy a cycle, or how far a phase lead or lag to be dealt with will exceed a neutral zone width; that is, what a phase shift will measure. The existence of a neutral zone helps prevent occurrence of a jitter of a bit clock due to a small jitter occurring at a data change point that is caused by a peak shift. Consequently, a response characteristic similar to that an analog PLL ensures can be established.

Next, the operation of the circuit will be described in conjunction with the time chart of FIG. 11.

An alphabet (b) represents a binary signal. For an optical recording medium, outputs of light receiving elements on a photodetector in an optical head are passed through amplifiers and I/V converters, then made into the binary signal. In this example, the low level of the binary signal corresponds to pits on the optical recording medium. The binary signal (b) is fed to a reference cycle calculating circuit 31, a D flip-flop 33, and a demodulation signal generating circuit 42. A high-frequency clock for determining the operation speeds of all the circuits is fed to the reference cycle calculating circuit 31, D flip-flops 33, 34, and 36, a counter 32, a JK flip-flop 41, and the demodulation signal generating circuit 42.

First of all, the reference cycle calculating circuit 31 detects an average cycle of the binary signal (b). The average cycle corresponds to an average $1\tau$. For example, when a technique of MFM is employed for modulation, pulse spacings of $1\tau$, $1.5\tau$, and $2\tau$ appear in the binary signal according to the modulation rule. From this viewpoint, an average $1\tau$ length can be calculated. A procedure of the calculation, which has been mentioned previously, will be reiterated. That is to say, a pulse spacing of a binary signal is measured for each pulse. Then, measured pulse spacings are added up. In the meantime, a multiple indicating about how many times each pulse spacing is larger than the $1\tau$ length (1, 1.5, or 2 times) a pulse should have by nature is detected. Then, detected multiples are added up. The added value of pulse spacings is divided by the added value of multiples, thus calculating an average $1\tau$ length.

At every trailing edge of the binary signal (b), a trailing edge detecting circuit made up of D flip-flops 33 and 34 and a gating circuit 35 outputs a lead pulse (c) having a duration comparable to one cycle of a high-frequency clock. The lead pulse (c) is fed to a lead terminal of a counter 32. At this time, an initial value (e) providing response characteristic data of a bit clock that is read from a ROM 37 is loaded. After that, the counter 32 continues to count high-frequency clock pulses until the next lead pulse (c) comes out. The count (d) of the load counter 32 is fed to the ROM 37, $\tau/4$ detecting circuit 38, $\tau/2$ detecting circuit 39, and 0 detecting circuit 40.

The $\tau/4$ detecting circuit 38 uses the count (d) of the counter 32 to detect a time when a quarter of an average cycle (a) is attained. More specifically, the value of the load count (d) is compared with a value provided by shifting the average cycle (a) 2 bits toward the LSB, then whether they match each other is checked. At this time, the D flip-flop 36 latches a value the reference cycle calculating circuit 31 calculates. The latched value (a) is used as an address pointing to a conversion table that is existent in the ROM 37, associated with a cycle, and specifies a response characteristic of a bit clock. Then, the ROM 37 retrieves the conversion table at the time when the average cycle (a) is attained, thus switching conversion tables. The τ/2 detecting circuit 39 uses an output (d) of the counter 32 to detect a time when half of the average cycle (a) is attained. To be more specific, the value of the load count (d) is compared with a value provided by shifting the average cycle 1 bit toward the LSB, then whether they match each other is checked.

The output of the τ/2 detecting circuit 39 is supplied to the J input terminal of the JK flip-flop 41. At this time, a bit clock (f) rises. The 0 detecting circuit 40 detects a time when the output value (d) of the counter 32 becomes 0. The output of the 0 detecting circuit 40 is fed to the K input terminal of the JK flip-flop 41. At this time, the bit clock (f) rises.

The demodulation signal generating circuit 42 generates a demodulation signal (g) which represents a 1 at the trailing edge of a binary signal and a 0 at the trailing edge of a bit clock signal. The D flip-flop 43 samples the demodulation signal (g) according to the bit clock (f), then provides a data sample output (h).

The operation of a bit clock regenerating circuit will be described with reference to the timing chart of FIG. 11 on the assumption that the average cycle may be 0FH or 17H.

First, as shown in FIG. 11, pulses a of a binary signal (b) having an average cycle (a) of 0FH will be discussed. A 0 detecting circuit 40 detects a 0 of a load count value (d). In time with 0 detection, a JK flip-flop 41 causes a bit clock (f) to fall. On the other hand, a demodulation signal generating circuit 42 detects the fall of the binary signal (b) and raises a demodulation signal to be fed. Next, when the load count value (d) becomes 07H indicating half of one cycle, the JK flip-flop 41 raises the bit clock (f) in response to an output of a τ/2 detecting circuit 39. When the bit clock rises, the demodulation signal (g) is high. Therefore, a data sample output of a D flip-flop 43 is a 1. The demodulation signal (g) falls at the trailing edge of the bit clock (f).

Next, pulses b of a binary signal (b) having an average cycle of 17H will be discussed.

A 0 detecting circuit 40 detects a 0 of a load count (d). In time with 0 detection, a JK flip-flop 41 causes a bit clock (f) to fall. On the other hand, a demodulation signal generating circuit 42 detects the fall of a binary signal (b), then raises a demodulation signal (g). Next, when the load count (d) becomes 0BH indicating half of one cycle, the JK flip-flop 41 raises the bit clock (f) in response to an output of a τ/2 detecting circuit 39. In time with the rising, the demodulation signal (g) is driven high. Therefore, a data sample output of a D flip-flop 43 is a 1.

As described so far, the fourth embodiment selects an optimal conversion table according to a detected average cycle despite a cycle (frequency) variation contained in a binary signal. Then, even if a jitter is present in the binary signal, the load count of a counter 32 is shifted optimally according to the conversion table. Thus, a phase shift is tracked. The conversion table has, as described previously, a neutral zone. This prevents too sensitive response to a jitter of a binary signal. Moreover, even if the binary signal contains a frequency (cycle) variation, a reference cycle is calculated according to the timing of a high-frequency clock so that an optical conversion table associated with the cycle variation can be adopted. Therefore, a stable bit clock can be generated. Thus, the fourth embodiment permits regeneration of stable and reliable information that is also immune to a jitter of a binary signal and a cycle variation.

What is claimed is:

1. A bit clock regenerating circuit comprising:
   an edge detecting means for producing an edge detection pulse upon detection of an edge of a binary input signal;
   a counting means in which an initial value is set in accordance with said edge detection pulse serving as a load signal and which counts clock pulses of a given frequency;
   a plurality of conversion tables associated with reference cycles of said binary input signal, said plurality of conversion tables having initial values to be supplied to said counting means, said initial value being determined in accordance with an output value of said counting means; and
   a conversion table selecting means including a reference cycle calculating means for calculating a reference cycle of pulse spacings using pulse spacings of said binary signal, said conversion table selecting means selecting a conversion table from among said plurality of conversion tables associated with reference cycles according to an output value of said reference cycle calculating means, and generating a bit clock according to an output value of said reference cycle calculating means and an output value of said counting means.

2. A bit clock regenerating circuit according to claim 1 wherein said conversion tables are contained in a ROM, and an output value of said reference cycle calculating means is fed to a high-order address input terminal of said ROM, while an output value of said counting means is fed to a low-order address input terminal of said ROM.

3. A bit clock regenerating circuit according to claim 1 further comprising a one-half cycle detecting means for seeking for a match between a one-half cycle of a reference cycle calculated by said reference cycle calculating means and an output value of said counting means, and a zero detecting means for detecting that an output value of said counting means is zero, wherein a bit clock is generated according to the output of said one-half cycle detecting means and the output of said zero detecting means.

4. A bit clock regenerating circuit according to claim 1 wherein said reference cycle calculating means calculates a reference cycle at every one-quarter of the reference cycle.

* * * * *